United States Patent
Vitale et al.

(10) Patent No.: US 9,240,809 B2
(45) Date of Patent: *Jan. 19, 2016

(54) METHODS FOR DIGITAL SIGNAL PROCESSING AND TRANSMISSION/RECEPTION SYSTEMS UTILIZING SAID METHODS

(71) Applicant: RAI RADIOTELEVISIONE ITALIANA S.P.A., Rome (IT)

(72) Inventors: Giovanni Vitale, Turin (IT); Vittoria Mignone, Piobesi Torinese (IT)

(73) Assignee: RAI RADIOTELEVISIONE ITALIANA S.P.A., Rome (IT)

( * ) Notice: Subject to any disclaimer, the term of this patent is extended or adjusted under 35 U.S.C. 154(b) by 32 days.

This patent is subject to a terminal disclaimer.

(21) Appl. No.: 14/218,295

(22) Filed: Mar. 18, 2014

(65) Prior Publication Data

US 2014/0250350 A1    Sep. 4, 2014

Related U.S. Application Data

(63) Continuation of application No. 12/920,597, filed as application No. PCT/IB2009/000391 on Mar. 2, 2009, now Pat. No. 8,718,186.

(30) Foreign Application Priority Data

Mar. 3, 2008 (IT) .............................. TO2008A0154
Mar. 6, 2008 (IT) .............................. TO2008A0173

(51) Int. Cl.
*H03M 13/00*   (2006.01)
*H03M 13/27*   (2006.01)
(Continued)

(52) U.S. Cl.
CPC ...... *H03M 13/2778* (2013.01); *H03M 13/1102* (2013.01); *H03M 13/1165* (2013.01);
(Continued)

(58) Field of Classification Search
CPC ... H03M 13/05; H03M 13/13; H03M 13/255; H03M 13/1102; H03M 13/1165; H03M 13/2778; H04L 1/0041; H04L 1/0045; H04L 1/0057; H04L 1/0071; H04L 27/04; H04L 27/06; H04L 27/28; H04L 1/34; H04K 1/10
See application file for complete search history.

(56) References Cited

U.S. PATENT DOCUMENTS 7,673,226 B2 *   3/2010   Eroz et al. ..................... 714/801
8,179,955 B2     5/2012   Taylor et al.
(Continued)

FOREIGN PATENT DOCUMENTS

CN   1619997 A   5/2005
CN   1697359 A   11/2005
(Continued)

OTHER PUBLICATIONS

Jia Minli et al., *Enhanced HARQ Schemes Based on LDPC Coded Irregular Modulation*, Microwave, Antenna, Propagation and EMC Technologies for Wireless Communications, 2007 International Symposium, Aug. 1, 2007, pp. 1088-1092.
(Continued)

*Primary Examiner* — Albert Decady
*Assistant Examiner* — Enamul M Kabir
(74) *Attorney, Agent, or Firm* — Workman Nydegger

(57) ABSTRACT

Methods for digital signal processing and transmission/reception systems utilizing the methods based on the use of LDPC codes, for example the LDPC code with a 3/5 code rate, in combination with a QAM modulation, for example the 16 QAM or 64 QAM or 256 QAM modulation. In transmission, a bit permutation (Demux) is carried out prior to the QAM constellation mapping function, and in reception, the bit permutation is carried out after the QAM constellation demapping function.

4 Claims, 9 Drawing Sheets

(51) Int. Cl.
*H03M 13/11* (2006.01)
*H03M 13/25* (2006.01)
*H04L 27/34* (2006.01)
*H04L 27/04* (2006.01)
*H04L 1/00* (2006.01)

(52) U.S. Cl.
CPC ........... *H03M13/255* (2013.01); *H04L 1/0041* (2013.01); *H04L 1/0045* (2013.01); *H04L 1/0071* (2013.01); *H04L 27/04* (2013.01); *H04L 27/34* (2013.01); *H04L 1/0057* (2013.01)

(56) References Cited

U.S. PATENT DOCUMENTS

| | | | |
|---|---|---|---|
| 2005/0060635 A1* | 3/2005 | Eroz et al. | 714/801 |
| 2005/0091565 A1* | 4/2005 | Eroz et al. | 714/752 |
| 2005/0149590 A1* | 7/2005 | Lee et al. | 708/200 |
| 2005/0246617 A1 | 11/2005 | Kyung et al. | |
| 2006/0156169 A1 | 7/2006 | Shen et al. | |
| 2007/0033486 A1 | 2/2007 | Hong et al. | |
| 2007/0220601 A1 | 9/2007 | Huelsbergen et al. | |
| 2008/0232489 A1* | 9/2008 | Tsai et al. | 375/260 |

FOREIGN PATENT DOCUMENTS

| | | |
|---|---|---|
| WO | 2006/020460 A | 2/2006 |
| WO | 2006/083233 A | 8/2006 |

OTHER PUBLICATIONS

T. Clevron et al., *Iterative Demodulation for DVB-S2*, Proc. Intern. Symposium on Personal, Indoor and Mobile Radio Communications (PIMRC), Sep. 11, 2005, vol. 4, pp. 2576-2580.

Takashi Yokokawa et al., *Parity and Column Twist Bit Interleaver for DVB-T2 LDPC Codes*, Turbo Codes and Related Topics, 2008 5$^{th}$ International Symposium, Sep. 1, 2008, pp. 123-127.

International Search Report dated Jun. 8, 2009, issued in PCT Application No. PCT/IB2009/000391, filed Mar. 2, 2009.

International Preliminary Report and Patentability and Written Opinion dated Sep. 7, 2010, issued in PCT Application No. PCT/IB2009/000391, filed Mar. 2, 2009.

Office Action dated Aug. 12, 2013 issued in Chinese Application No. 200980107396.7, filed Mar. 2, 2009 (w English translation).

A. Morello et al., *DVB-S2: The Second Generation Standard for Satellite Broad-Band Services*, Proceedings of the IEEE, vol. 94, Issue 1, Jan. 2006, pp. 210-227.

* cited by examiner

METHODS FOR DIGITAL SIGNAL PROCESSING AND TRANSMISSION/RECEPTION SYSTEMS UTILIZING SAID METHODS

CROSS-REFERENCE TO RELATED APPLICATIONS

This application is a continuation of U.S. application Ser. No. 12/920,597, filed Dec. 6, 2010, which claims priority to PCT Application No. PCT/IB2009/000391, filed Mar. 2, 2009, which claims priority to Italian Application Nos. TO2008A000154, filed Mar. 3, 2008 and TO2008A000173, filed Mar. 6, 2008, which are incorporated herein by specific reference.

BACKGROUND OF THE INVENTION

1. The Field of the Invention

The present invention relates to methods for digital signal processing and to transmission/reception systems that utilize said methods.

2. The Relevant Technology

The invention is intended mainly, but not exclusively, for receiving and transmitting digital audio and video signals, in particular those involved in the broadcasting of second-generation digital terrestrial television signals.

In order to protect the signals from the distortions of the transmission channel, the second-generation systems for broadband satellite broadcasting (DVB-S2) utilizes the LDPC (Low Density Parity Check) encoding associated with the QPSK, 8PSK, 16APSK and 32APSK modulations (FIG. 1), which are suitable for transmission over a non-linear channel such as the satellite one. A description of the DVB-S2 standard and LDPC codes can be found, for example, in A. Morello, V. Mignone, "DVB-S2: The Second Generation Standard for Satellite Broad-band Services", Proceedings of the IEEE, Volume 94, Issue 1, January 2006, Pages 210-227.

For the purpose of better exploiting the potentiality of the codes, the DVB-S2 standard provides that an interleaver is interposed between the LDPC encoder and the 8PSK, 16APSK and 32APSK constellation mapper in order to achieve an improved association between the bits of the encoded word and the bits carried by the constellation points.

In the interleaver defined in the DVB-S2 standard, the encoded packet outputted by the LDPC encoder (formed by a number of bits equal to 16,200 or 64,800, which number is generally referred to with the symbol "NFRAME") is written by columns in a matrix having N columns, where N is the number of bits carried by the constellation (N is 3 for 8PSK, 4 for 16APSK, 5 for 32APSK), and NFRAME/N rows (FIG. 2), and is read by rows; reading takes place from left to right for all code rates provided by the standard, with the exception of the 3/5 rate, where reading takes place from right to left. The association with the constellation points or coordinates takes place as shown in FIG. 1.

For receiving and transmitting numerical audio and video signals involved in the broadcasting of second-generation digital terrestrial television signals, it has recently been thought of using the same encoding scheme as that employed in the DVB-S2 standard, i.e., the same LDPC codes, however associated with QAM (Quadrature Amplitude Modulation) modulations, in particular with the QPSK, 16 QAM, 64 QAM and 256 QAM modulations (FIGS. 3A-3D).

The Applicant has realised that, with QAM modulations, the performance offered by the LDPC codes are good but not wholly satisfactory as to the signal-to-noise ratio (SNR) required for reaching the QEF (Quasi Error Free) condition; as known, such a condition corresponds to the case wherein less than one error is received per hour of received program.

The general object of the present invention is to solve the above-mentioned problem and, in particular, to improve the association between the bits outputted by the LDPC encoder and the constellation coordinates of QAM modulations; more particularly, the present invention deals with the LDPC encoding with a 3/5 code rate and with the 16 QAM or 64 QAM or 256 QAM modulation.

Said objects are achieved through the methods for processing digital signals and the transmission and reception systems having the features set out in the appended claims, which are intended as an integral part of the present description.

BRIEF DESCRIPTION OF THE DRAWINGS

The invention will now be described in detail in some of its preferred embodiments, which are provided herein by way of non-limiting example, by referring to the annexed drawings, wherein.

DETAILED DESCRIPTION OF THE PREFERRED EMBODIMENTS

Figure 4:
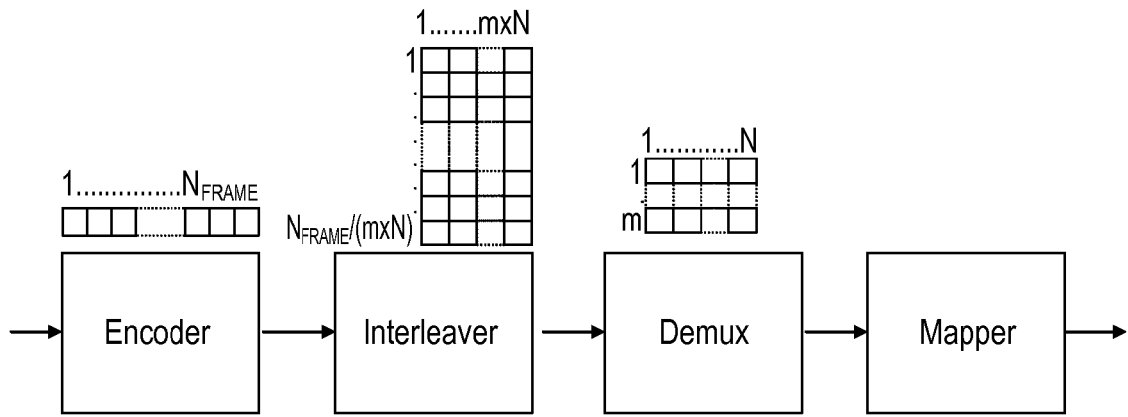
FIG. 4 is a much simplified block diagram of a system for processing the modulating digital signal according to the present invention.
Figure 5:
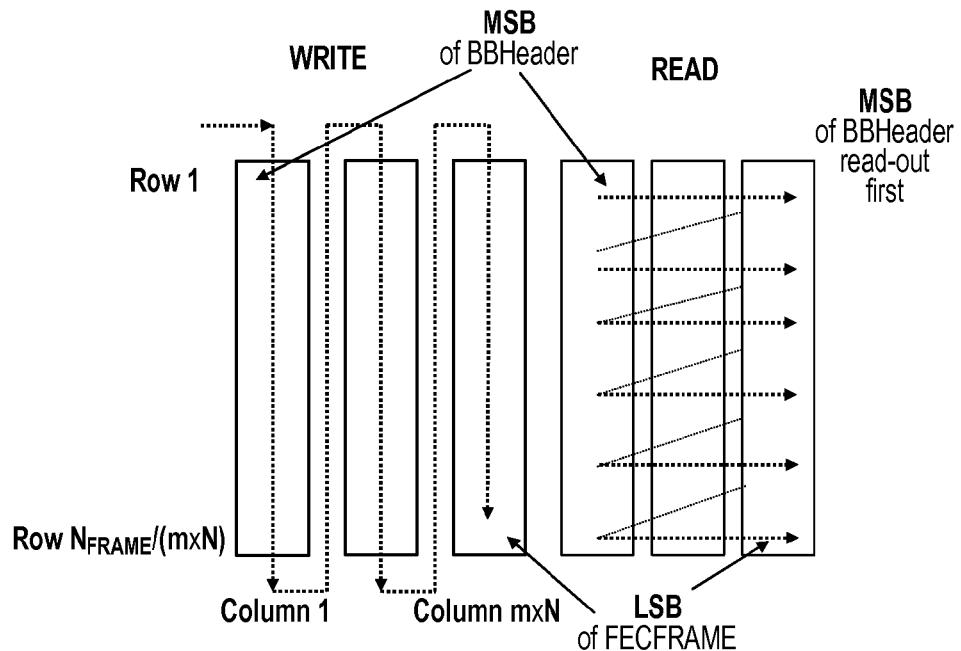
FIG. 5 is an explanatory general diagram of the interleaver of FIG. 4.

Getting now into more detail of the description, FIG. 4 schematically shows the process for associating the bits of the modulating information stream with the points or coordinates of the QAM modulation constellation.

The "Encoder" block receives the modulating information stream and outputs an encoded information stream organized in packets consisting of NFRAME bits, which may be either 64,800 or 16,200; the code employed is the LDPC code, in particular the one of the DVB-S2 standard, with a 3/5 code rate.

In the "Interleaver" block, said packets are written into an interleaving matrix having a total size NFRAME; said matrix is constituted by m×N columns and NFRAME/(m×N) rows.

The "Demux" block carries out a permutation of the bits received from the "Interleaver" block; such bits are received by the interleaving matrix in groups of m×N bits at a time, where N is the number of bits carried by the constellation (N=2 for QPSK, N=4 for 16 QAM, N=6 for 64 QAM, N=8 for 256 QAM), and "m" is an integer greater than or equal to 1. The "Demux" block associates them in m groups of N bits and permutes them according to predetermined schemes by taking into account the type of modulation (i.e., the QAM level), the code and the type of transmission channel, and then it outputs them.

Figure 3A:
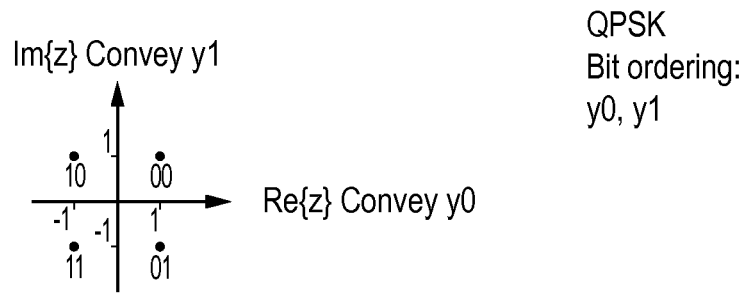
FIGS. 3A-3D are a schematic representation of the QPSK, 16 QAM, 64 QAM and 256 QAM constellations applicable to the reception and transmission of audio and video signals involved in the broadcasting of second-generation digital terrestrial television signals.
Figure 3B:
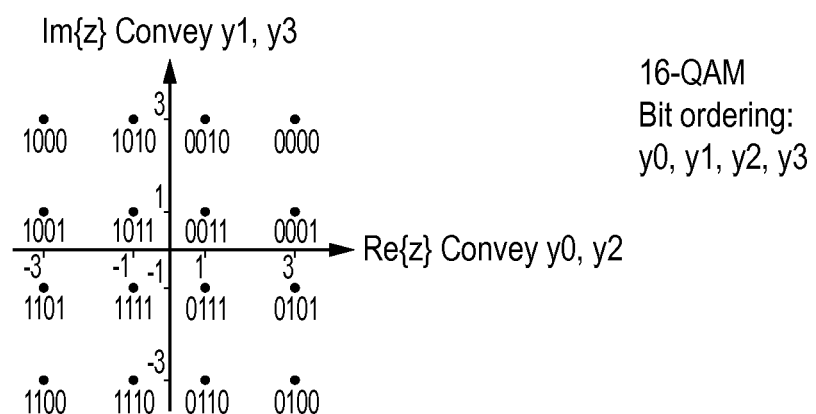
Figure 3C:
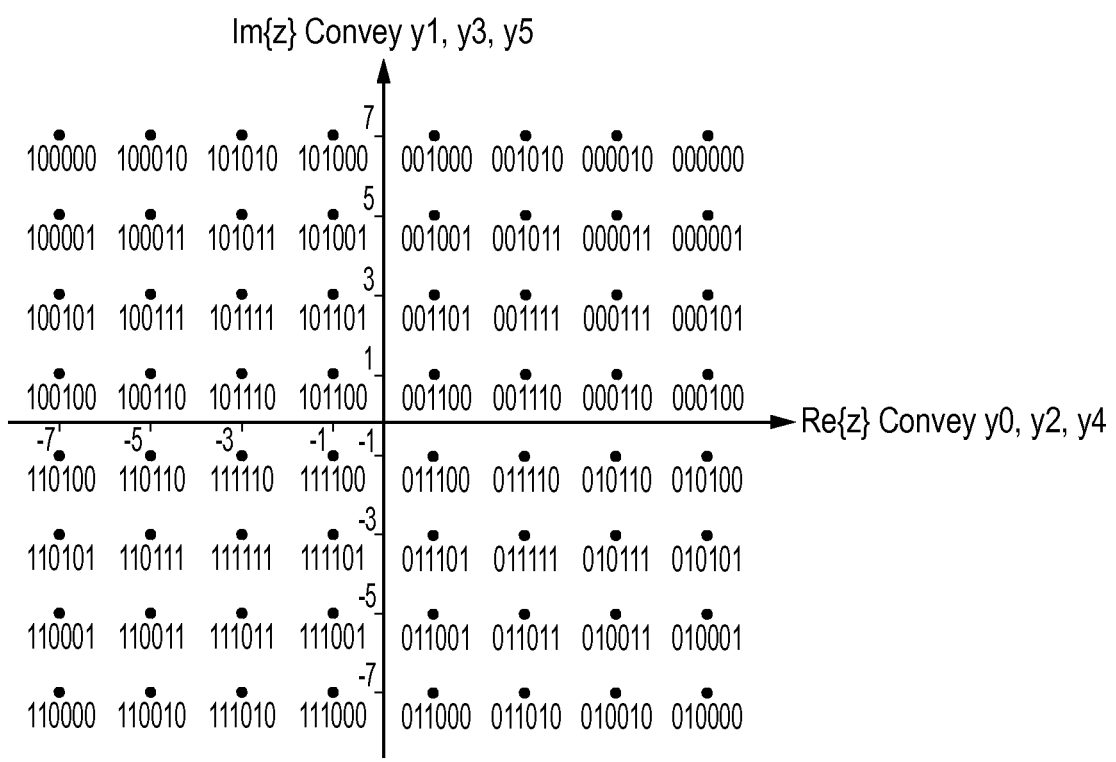
Figure 3D:
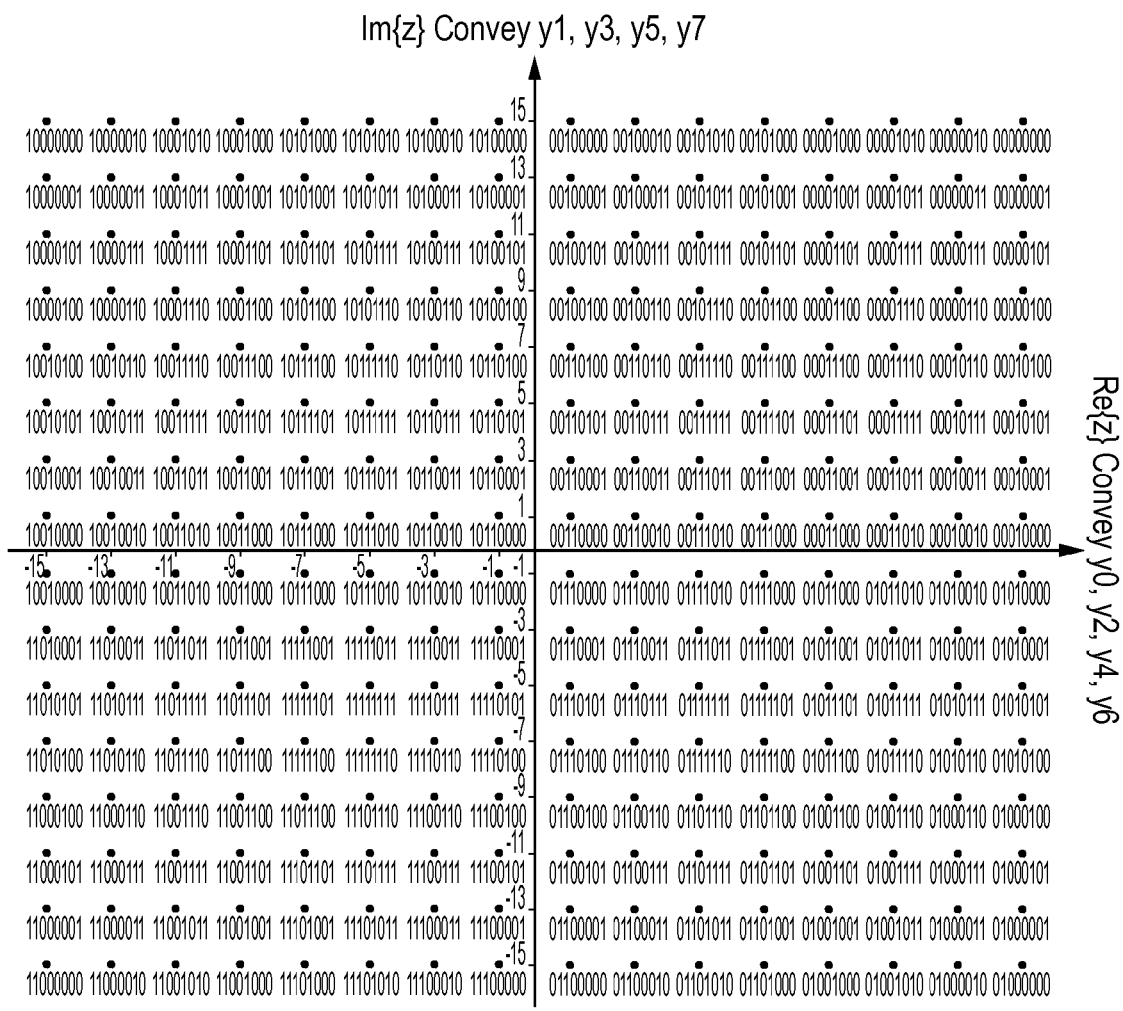

The "Mapper" block associates the N-ples of bits outputted by the "Demux" block with the points or coordinates of the constellation, e.g. as shown in FIGS. 3B-3D for QAM modulations.

It is worth pointing out that the blocks shown in FIG. 4 are only those which are essential for understanding the present invention; it should not therefore be excluded the presence of intermediate blocks, e.g., between the "Demux" block and the "Mapper" block, adapted to perform specific signal processing functions.

The present invention proposes particular permutation schemes which may be adopted for the QAM modulations and LDPC codes having different code rates provided, for example, by the DVB-S2 standard in association with different types of interleaving.

The preferred embodiments of the present invention refer to the 16 QAM, 64 QAM and 256 QAM modulations and to the LDPC code with a 3/5 code rate.

Figure 1:
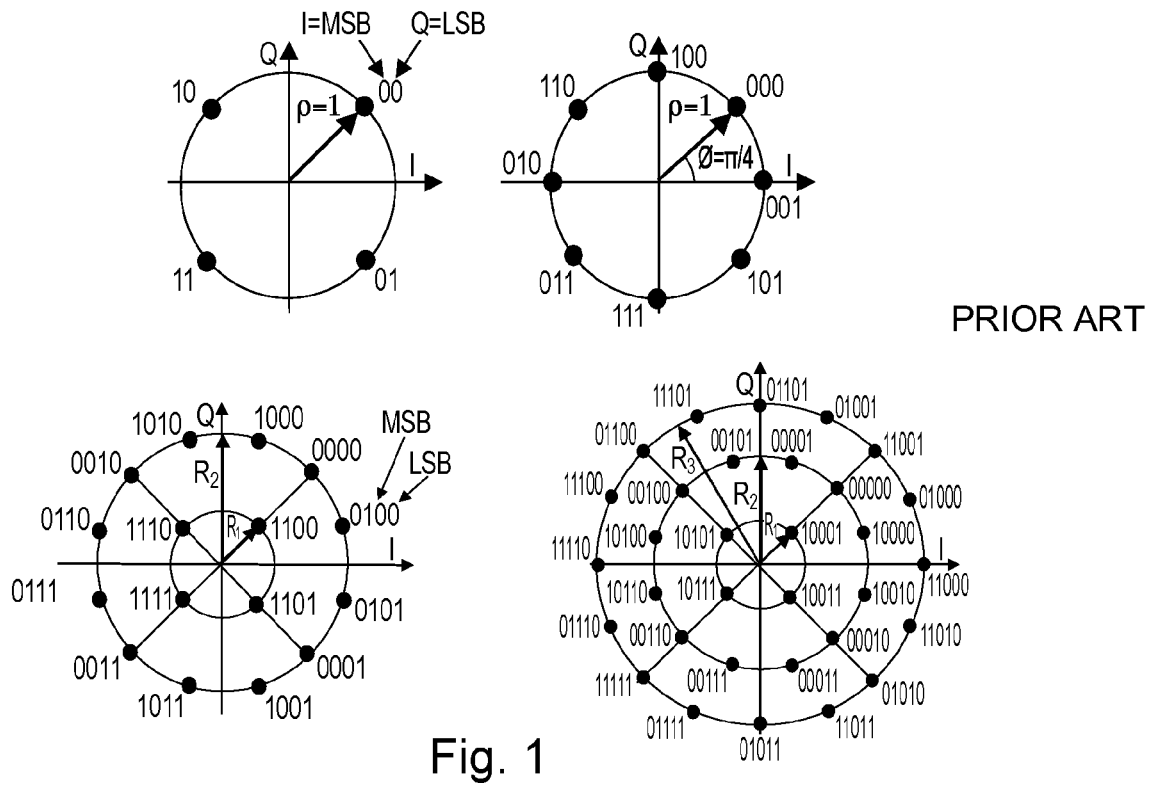
FIG. 1 is a schematic representation of the QPSK, 8PSK, 16APSK and 32APSK constellations included, among others, in the DVB-S2 standard.
Figure 2:
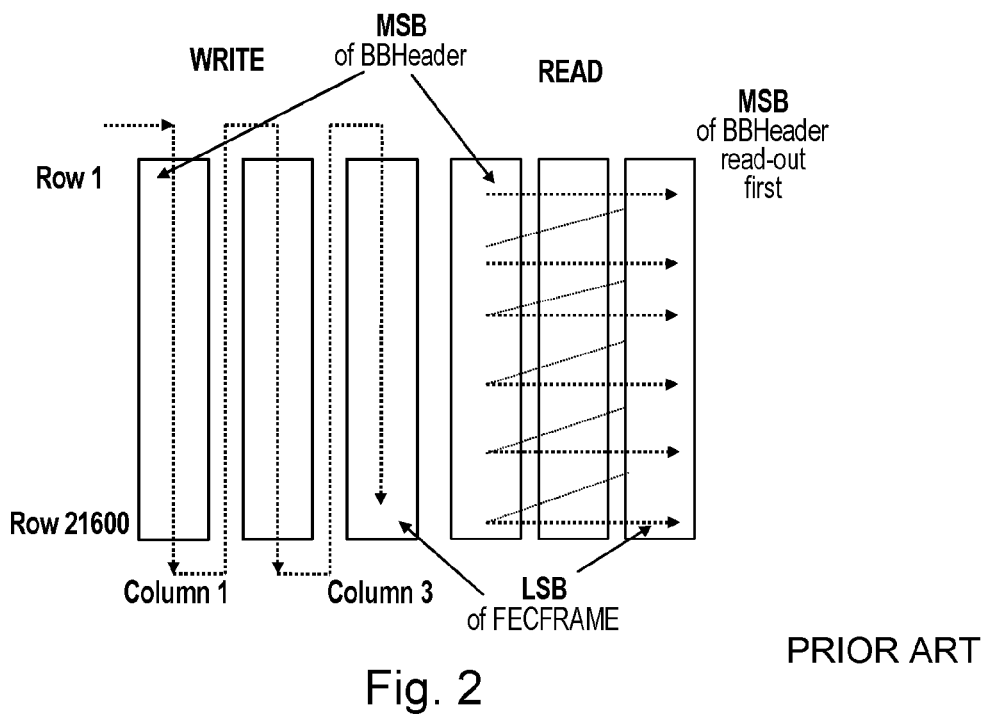
FIG. 2 is an explanatory diagram of the interleaver provided by the DVB-S2 standard, with reference to 8PSK modulation.

The preferred embodiment of the present invention employs an interleaver which is equal or similar to the one of the DVB-S2 standard (FIG. 2), with a number of bits/columns dependent on the QAM modulation level type.

Preferably, then, this preferred embodiment provides that the N-ples of bit outputted by the "Demux" are associated to the points of the constellations QAM through the "Mapper" block according to the labeling used in the DVB-T Standard (FIGS. 3B-3D).

According to a first embodiment relating to 256 QAM modulation, in the "Demux" block in use "m" is equal to 1 (i.e., 8 bits for 256 QAM), and therefore the rows of the matrix of the "Interleaver" block are read one at a time.

Figure 6:
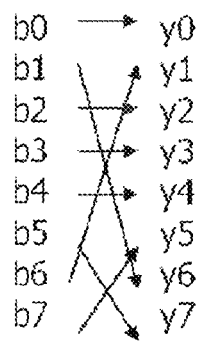
FIG. 6 is a schematical representation of the function carried out by the "Demux" block of FIG. 5 according to a first embodiment of the present invention relating to 256 QAM modulation.

The N bits inputted to the "Demux" block are permuted as specified in FIG. 6 (first embodiment), for 256 QAM modulation encoded with a 3/5 rate. This means that, given the N bits b0 to b7 (inputted to the block), the N bits carried by the 256 QAM constellation y0 to y7 (outputted by the block) are determined as follows:

$$y0=b0, y1=b6, y2=b2, y3=b3, y4=b4, y5=b7, y6=b1, y7=b5$$

where b0 and y0 are the most significant bits (MSB), and b7 and y7 are the least significant bits (LSB).

As an alternative (second embodiment), the present invention provides for using a matrix interleaver in the form of a matrix having 2×N columns and NFRAME/(2×N) rows, written by columns from top to bottom and read by rows from left to right.

Figure 7:
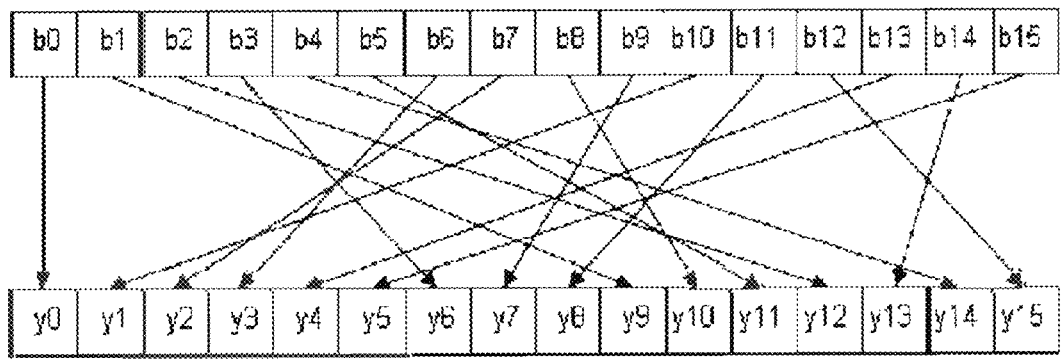
FIG. 7 is a schematical representation of the function carried out by the "Demux" block of FIG. 5 according to a second embodiment of the present invention relating to 256 QAM modulation.

In this case, the "Demux" block operates with m equal to 2. The 2×N bits inputted to the "Demux" block are permuted as specified in FIG. 7, for 256 QAM modulation encoded with a 3/5 rate, and are associated with 2 consecutive symbols of 256 QAM modulation.

This means that, given the 2×N bits b0 to b15, the 2×N bits carried by the 256 QAM constellation y0 to y15 are determined as follows:

$$y0=b0, y1=b10, y2=b7, y3=b6, y4=b13, y5=b15,$$
$$y6=b3, y7=b9, y8=b11, y9=b1, y10=b8, y11=b5,$$
$$y12=b2, y13=b14, y14=b4, y15=b12$$

where b0 and y0 are the most significant bits (MSB), and b15 and y15 are the least significant bits (LSB).

More precisely, the "Mapper" block receives the bits y0 to y7 first, followed by the bits y8 to y15.

Figure 8:
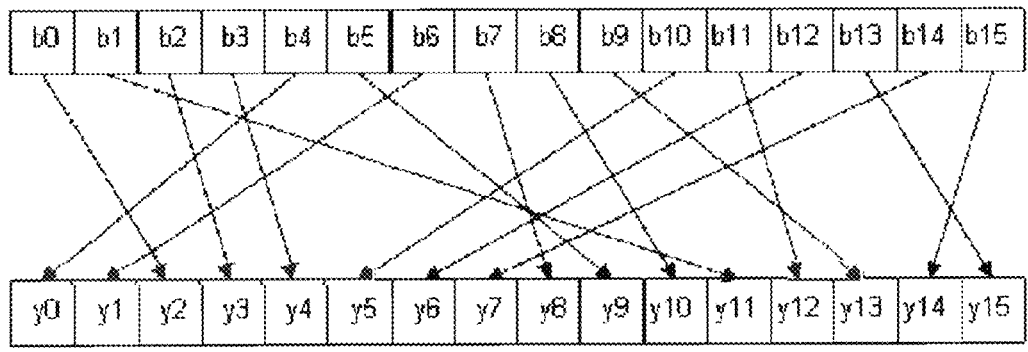
FIG. 8 is a schematical representation of the function carried out by the "Demux" block of FIG. 5 according to a third embodiment of the present invention relating to 256 QAM modulation.

Still referring to the case wherein the "Demux" block operates with m equal to 2, another permutation has proven to be advantageous (third embodiment); the 2×N bits inputted to the "Demux" block are permuted as specified in FIG. 8, for 256 QAM modulation encoded with a 3/5 rate, and are associated with 2 consecutive symbols of 256 QAM modulation.

This means that, given the 2×N bits b0 to b15, the 2×N bits carried by the 256 QAM constellation y0 to y15 are determined as follows:

$$y0=b4, y1=b6, y2=b0, y3=b2, y4=b3, y5=b10,$$
$$y6=b12, y7=b14, y8=b7, y9=b5, y10=b8,$$
$$y11=b1, y12=b11, y13=b9, y14=b15, y15=b13$$

Figure 9:
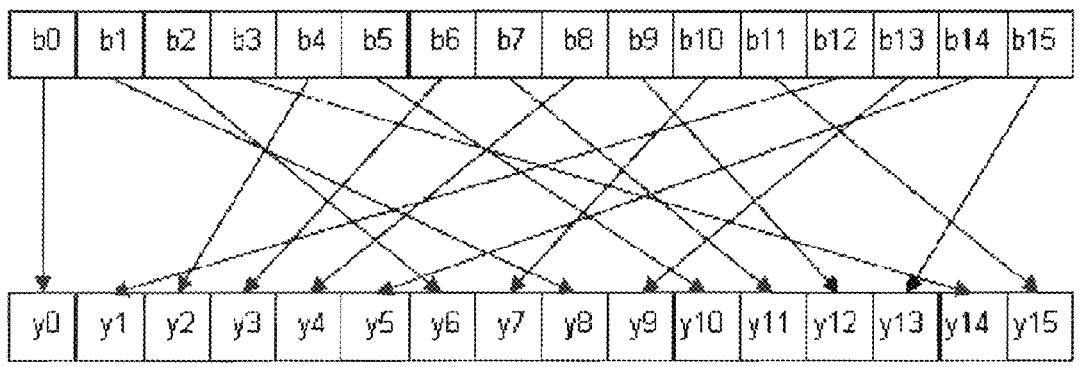
FIG. 9 is a schematical representation of the function carried out by the "Demux" block of FIG. 5 according to a fourth embodiment of the present invention relating to 256 QAM modulation.

Still referring to the case wherein the "Demux" block operates with m equal to 2, a further permutation has also proven to be advantageous (fourth embodiment); the 2×N bits inputted to the "Demux" block are permuted as specified in FIG. 9, for 256 QAM modulation encoded with a 3/5 rate, and are associated with 2 consecutive symbols of 256 QAM modulation.

This means that, given the 2×N bits b0 to b15, the 2×N bits carried by the 256 QAM constellation y0 to y15 are determined as follows:

$$y0=b0, y1=b12, y2=b4, y3=b6, y4=b8, y5=b14,$$
$$y6=b2, y7=b10, y8=b1, y9=b13, y10=b5,$$
$$y11=b7, y12=b9, y13=b15, y14=b3, y15=b11$$

Figure 10:
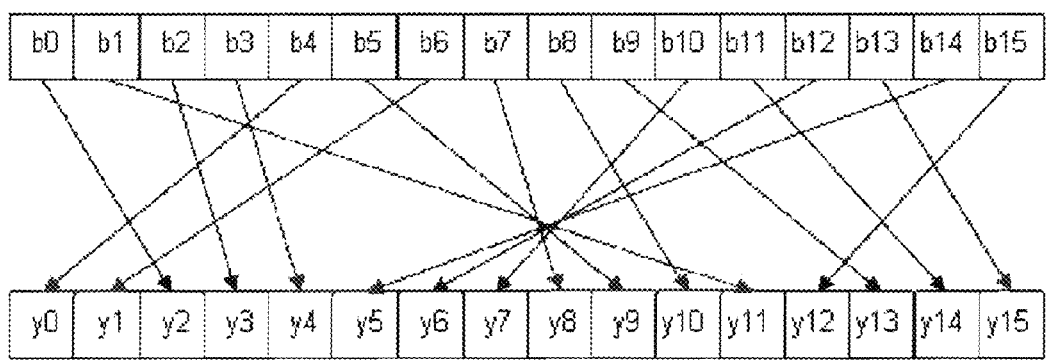
FIG. 10 is a schematical representation of the function carried out by the "Demux" block of FIG. 5 according to a fifth embodiment of the present invention relating to 256 QAM modulation.

Finally, still referring to the case wherein the "Demux" block operates with m equal to 2, yet another permutation has proven to be advantageous (fifth embodiment); the 2×N bits inputted to the "Demux" block are permuted as specified in FIG. 10, for 256 QAM modulation encoded with a 3/5 rate, and are associated with 2 consecutive symbols of 256 QAM modulation.

This means that, given the 2×N bits b0 to b15, the 2×N bits carried by the 256 QAM constellation y0 to y15 are determined as follows:

y0=b4, y1=b6, y2=b0, y3=b2, y4=b3, y5=b14, y6=b12, y7=b10, y8=b7, y9=b5, y10=b8, y11=b1, y12=b15, y13=b9, y14=b11, y15=b13

For 16 QAM or 64 QAM modulations, the present invention provides for using a matrix interleaver in the form of a matrix having 2×N columns and NFRAME/(2×N) rows, written by columns from top to bottom and read by rows from left to right. In this case, the "Demux" block of FIG. 4 may operate, for example, with m equal to 2.

Figure 11:
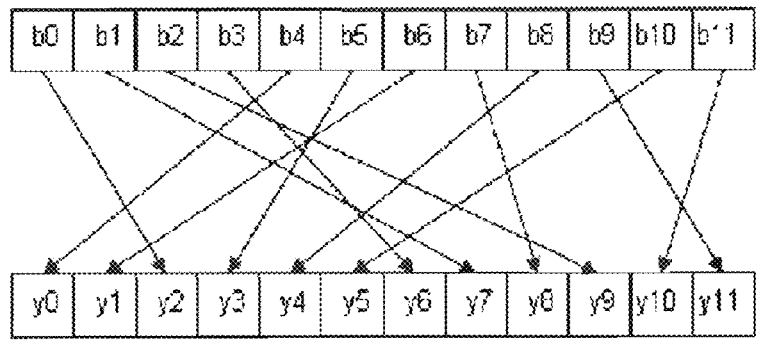
FIG. 11 is a schematical representation of the function carried out by the "Demux" block of FIG. 5 according to a sixth embodiment of the present invention relating to 64 QAM modulation.

The 2×N bits inputted to the "Demux" block may be permuted, for example, as specified in FIG. 11 (sixth embodiment), for 64 QAM modulation, and associated with 2 consecutive symbols of 64 QAM modulation.

This means that, given the 2×N bits b0 to b11, the 2×N bits carried by the 64 QAM constellation y0 to y11 are determined as follows:

y0=b4, y1=b6, y2=b0, y3=b5, y4=b8, y5=b10 y6=b3, y7=b1, y8=b7, y9=b2, y10=b11, y11=b9 where b0 and y0 are the most significant bits (MSB), and b11 and y11 are the least significant bits (LSB).

More precisely, the "Mapper" block receives the bits y0 to y5 first, followed by the bits y6 to y11.

Figure 12:
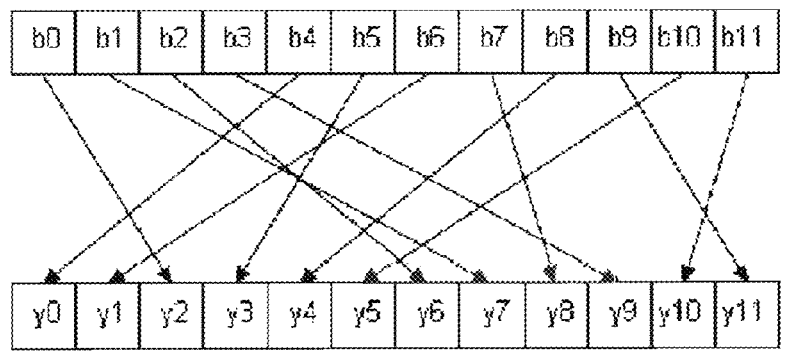
FIG. 12 is a schematical representation of the function carried out by the "Demux" block of FIG. 5 according to a seventh embodiment of the present invention relating to 64 QAM modulation.

Still referring to the case of 64 QAM modulation wherein the "Demux" block operates with m equal to 2, another permutation has proven to be advantageous (seventh embodiment); the 2×N bits inputted to the "Demux" block are permuted as specified in FIG. 12 and are associated with 2 consecutive symbols of 64 QAM modulation.

This means that, given the 2×N bits b0 to b11, the 2×N bits carried by the 64 QAM constellation y0 to y11 are determined as follows:

y0=b4, y1=b6, y2=b0, y3=b5, y4=b8, y5=b10 y6=b2, y7=b1, y8=b7, y9=b3, y10=b11, y11=b9

Figure 13:
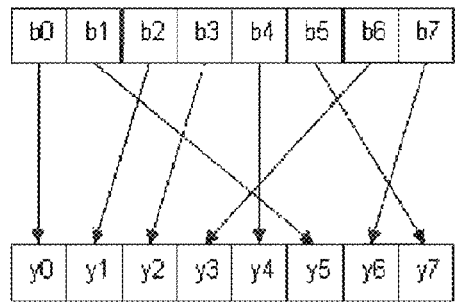
FIG. 13 is a schematical representation of the function carried out by the "Demux" block of FIG. 5 according to an eighth embodiment of the present invention relating to 16 QAM modulation.

In the case of 16 QAM modulation, the 2×N bits inputted to the "Demux" block may be permuted, for example, as specified in FIG. 13 (eighth embodiment) and associated with 2 consecutive symbols of 16 QAM modulation.

This means that, given the 2×N bits b0 to b7, the 2×N bits carried by the 16 QAM constellation y0 to y7 are determined as follows:

y0=b0, y1=b2, y2=b3, y3=b6, y4=b4, y5=b1, y6=b7, y7=b5

Figure 14:
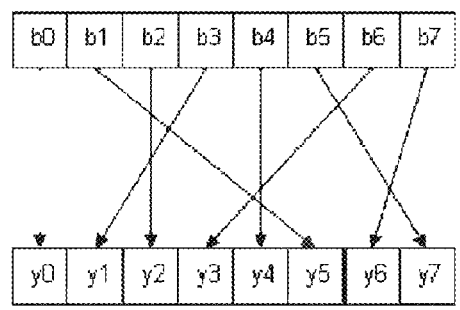
FIG. 14 is a schematical representation of the function carried out by the "Demux" block of FIG. 5 according to a ninth embodiment of the present invention relating to 16 QAM modulation.

Still referring to the case of 16 QAM modulation wherein the "Demux" block operates with m equal to 2, a second permutation has also proven to be advantageous (ninth embodiment); the 2×N bits inputted to the "Demux" block are permuted as specified in FIG. 14 and are associated with 2 consecutive symbols of 16 QAM modulation.

This means that, given the 2×N bits b0 to b7, the 2×N bits carried by the 16 QAM constellation y0 to y7 are determined as follows:

y0=b0, y1=b3, y2=b2, y3=b6, y4=b4, y5=b1, y6=b7, y7=b5

Figure 15:
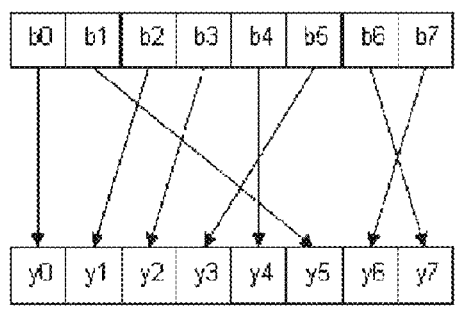
FIG. 15 is a schematical representation of the function carried out by the "Demux" block of FIG. 5 according to a tenth embodiment of the present invention relating to 16 QAM modulation.

Still referring to the case of 16 QAM modulation wherein the "Demux" block operates with m equal to 2, a third permutation has also proven to be advantageous (tenth embodiment); the 2×N bits inputted to the "Demux" block are permuted as specified in FIG. 15 and are associated with 2 consecutive symbols of 16 QAM modulation.

This means that, given the 2×N bits b0 to b7, the 2×N bits carried by the 16 QAM constellation y0 to y7 are determined as follows:

y0=b0, y1=b2, y2=b3, y3=b5, y4=b4, y5=b1, y6=b7, y7=b6

Figure 16:
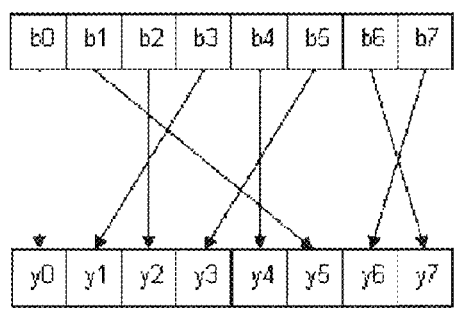
FIG. 16 is a schematical representation of the function carried out by the "Demux" block of FIG. 5 according to an eleventh embodiment of the present invention relating to 16 QAM modulation.

Still referring to the case of 16 QAM modulation wherein the "Demux" block operates with m equal to 2, a fourth permutation has also proven to be advantageous (eleventh embodiment); the 2×N bits inputted to the "Demux" block are permuted as specified in FIG. 16 and are associated with 2 consecutive symbols of 16 QAM modulation.

This means that, given the 2×N bits b0 to b7, the 2×N bits carried by the 16 QAM constellation y0 to y7 are determined as follows:

y0=b0, y1=b3, y2=b2, y3=b5, y4=b4, y5=b1, y6=b7, y7=b6

The above-described methods may be used to advantage in a system for transmitting digital signals based on a 16 QAM or 64 QAM or QAM256 modulator, and particularly in an audio/video digital signal transmitter for broadcasting digital terrestrial television signals.

As is apparent to those skilled in the art, if the above-described methods are applied in transmission, reverse methods will have to be applied in reception.

As known, the transmission of television signals is carried out by radio frequency transmitters, while the reception of television signals occurs through television receivers typically installed in the television service users' homes.

The invention claimed is:

1. A method for processing and transmitting digital signals to a QAM modulator of the 64QAM type, comprising:
   encoding the signals in packets according to an LDPC code with a 3/5 code rate,
   writing the packets into an interleaving matrix by an Interleaver block,
   carrying out, by a Demux block, a bit permutation of the bits received from the Interleaver block prior to the constellation mapping function, wherein the permutation is carried out on 12-bit words,
   generating a word Y comprising the bits y0 y1 y2 y3 y4 y5 y6 y7 y8 y9 y10 y11, in this order, starting from a word B comprising the bits b0 b1 b2 b3 b4 b5 b6 b7 b8 b9 b10 b11, in this order, the bits y0 and b0 being respectively the most significant bits of the words Y and B, and the bits y11 and b11 being respectively the least significant bits of the words Y and B, and wherein:

y0=b4, y1=b6, y2=b0, y3=b5, y4=b8, y5=b10, y6=b2, y7=b1, y8=b7, y9=b3, y10=b11, y11=b9.

2. A system comprising a QAM modulator, adapted to implement the method according to claim 1.

3. A method for processing digital signals received by a QAM demodulator of the 64QAM type, comprising:
   encoding the signals in packets according to an LDPC code with a 3/5 code rate,
   writing the packets into an interleaving matrix by an Interleaver block,
   carrying out, by a Demux block, a bit permutation of the bits received from the Interleaver block after the constellation demapping function, wherein the permutation is carried out on 12-bit words, generating a word B comprising the bits b0 b1 b2 b3 b4 b5 b6 b7 b8 b9 b10 b11, in this order, starting from a word Y comprising the bits y0 y1 y2 y3 y4 y5 y6 y7 y8 y9 y10 y11, in this order, the bits y0 and b0 being respectively the most significant bits of the words Y and B, and the bits y11 and b11 being respectively the least significant bits of the words Y and B, wherein:

$y0=b4, y1=b6, y2=b0, y3=b5, y4=b8, y5=b10\ y6=b2,$
$y7=b1, y8=b7, y9=b3, y10=b11, y11=b9.$

4. A system for receiving digital signals comprising a QAM demodulator, adapted to implement the method according to claim 3.

* * * * *